(12) United States Patent
Lee et al.

(10) Patent No.: US 7,855,086 B2
(45) Date of Patent: Dec. 21, 2010

(54) METHOD FOR MONITORING FABRICATION PARAMETER

(75) Inventors: Yi Feng Lee, Taoyuan County (TW);
Chun Chi Chen, Taipei (TW);
Yun-Zong Tian, Taichung County (TW);
Wei Jun Chen, Taichung County (TW)

(73) Assignee: Inotera Memories, Inc., Taoyuan County (TW)

( * ) Notice: Subject to any disclaimer, the term of this patent is extended or adjusted under 35 U.S.C. 154(b) by 51 days.

(21) Appl. No.: 12/469,051

(22) Filed: May 20, 2009

(65) Prior Publication Data
US 2010/0233830 A1    Sep. 16, 2010

(30) Foreign Application Priority Data
Mar. 11, 2009    (TW) ............................... 98107808 A (51) Int. Cl.
*H01L 21/00*    (2006.01)

(52) U.S. Cl. ........................................................ 438/7

(58) Field of Classification Search ........................ None
See application file for complete search history.

(56) References Cited

U.S. PATENT DOCUMENTS

| | | | |
|---|---|---|---|
| 6,304,836 B1 * | 10/2001 | Krivokapic et al. ........... 703/14 |
| 6,553,522 B1 * | 4/2003 | Dalal et al. .................. 714/724 |
| 2005/0060336 A1 * | 3/2005 | Abercrombie et al. ....... 707/102 |
| 2005/0090916 A1 * | 4/2005 | Aghababazadeh et al. .... 700/90 |
| 2007/0239383 A1 * | 10/2007 | Funk et al. ................... 702/107 |
| 2008/0148197 A1 * | 6/2008 | Bickford et al. ................ 716/3 |

* cited by examiner

*Primary Examiner*—Charles D Garber
*Assistant Examiner*—Andre' C Stevenson
(74) *Attorney, Agent, or Firm*—Rosenberg, Klein & Lee (57) ABSTRACT

A method for monitoring fabrication parameters comprises steps of: obtaining a normal parameter variance curve and a comparing parameter variance curve; defining a plurality of normal parameter points on the normal parameter variance curve; defining a plurality of comparing parameter points on the comparing parameter variance curve; finding out the corresponding comparing parameter points nearest to the normal parameter points; calculating the distances between the normal parameter points and the corresponding comparing parameter points thereof; summing up the distances so as to receive a total distance; and determining whether or not the total distance exceeds a limit. Via this arrangement, when fabrication parameter of tool is abnormal, it can be efficiently and immediately determined.

18 Claims, 7 Drawing Sheets

METHOD FOR MONITORING FABRICATION PARAMETER

BACKGROUND OF THE INVENTION

1. Field of the Invention

The present invention relates to a method for monitoring fabrication parameters; especially, the present invention relates to a method for monitoring fabrication parameters applicable in semiconductor manufacturing.

2. Description of Related Art

In semiconductor manufacturing, each lot of wafers needs to pass through various fabrication processes so as to complete and form the required semiconductor components, wherein each process may influence the final yield and throughput of the semiconductor components.

Since every step performed within a process may involve several tools, suppose an engineer is informed of an abnormality in one lot of wafers (e.g. incorrect electrical features), it is actually very difficult to precisely locate the tool causing such an error among them. Additionally, because each tool has various fabrication parameters, it is even more challenging to further find out which fabrication parameter(s) is/are to be fixed.

It is possible to decide whether or not a certain fabrication parameters are responsible for a detected wafer abnormality by means of monitoring such fabrication parameters on every tool. However, this approach may not be precise; or sometimes the fabrication parameters have exceeded the limits, and so the tools alarmed and notified the engineer for verifications, but later it is realized that these fabrication parameters are not the actual causes for the wafer abnormality. And more seriously, duration required for verification by engineers may result in undesirable loss of tool throughput.

Furthermore, the fact that fabrication parameters did not exceed limits may not necessarily indicate that such fabrication parameters are not the real causes of the wafer abnormality. As the fabrication parameters fluctuate dramatically, wafer abnormality could be accordingly generated, but conventional solutions are incapable of distinguishing variations in fabrication parameters.

Therefore, how to effectively and quickly determine and locate the fabrication parameters leading to the wafer abnormality is indeed an issue that needs to be addressed for semiconductor manufacturers.

Accordingly, in consideration of the improvable drawbacks as discussed above, the inventors of the present invention propose a solution characterized in reasonable design and enabling effective improvement on the aforementioned defects.

SUMMARY OF THE INVENTION

The objective of the present invention is to provide a method for monitoring fabrication parameters, which effectively determines whether or not abnormality occurs in the fabrication parameters of a tool, so as to notify users in real-time for further verification or maintenance operations.

To achieve the aforementioned objective, the present invention provides a method for monitoring fabrication parameters comprising the following steps: obtaining a normal parameter variance curve and a comparing parameter variance curve; defining a plurality of normal parameter points on the normal parameter variance curve; defining a plurality of comparing parameter points on the comparing parameter variance curve; finding the corresponding comparing parameter points nearest to the normal parameter points; calculating the distances between the normal parameter points and the corresponding comparing parameter points thereof; summing up the distances so as to receive a total distance; and determining whether or not the total distance exceeds a limit.

The present invention provides the following beneficial effects:

1. The present invention determines whether or not the comparing parameters are normal based on the integral difference between the variance curve of comparing parameters (fabrication parameters with unknown normality) and the variance curve of normal parameters, thereby providing a more accurate and precise determination;

2. The present invention can better determine whether or not the comparing parameters are normal by means of monitoring the variance trend of the comparing parameters.

3. The present invention is programmable and can be performed with an information product, thus providing faster execution time and achieving the effect of real-time monitoring on the comparing parameters.

In order to better appreciate the characteristics and technical contents of the present invention, references are herein made to the following detailed descriptions and appended drawings; however, the appended drawings are simply of illustrative purposes, rather than intended for limiting the scope of the present invention thereto.

DETAILED DESCRIPTION OF THE PREFERRED EMBODIMENTS

The present invention discloses a method for monitoring fabrication parameters applicable in various manufacturing workflows; herein the embodiments take semiconductor fabrications as examples.

There exists several tools for semiconductor fabrication, and while the tools are machining on a lot of wafers, the fabrication parameters (e.g voltage values) of such tools may vary along the machining times; for example, a starting voltage value can be zero, then gradually increasing up to a certain value and holds, then subsequently be restored back to zero. Such a variation of fabrication parameter over time can be recorded as a parameter variance curve, and the parameter variance curve can be generated by the Fault Detection and Classification (FDC) system commonly used in the field of semiconductor.

Each fabrication parameter on a tool has its own normal parameter variance curve, and after machining on a lot of wafers by the tool, suppose the features of the wafers and design requirements are matched, then the variation of the fabrication parameter over machining time needs to be consistent with the normal parameter variance curve, yet the difference between them should be sufficiently small. The present invention herein proposes a method for monitoring and determining such a difference between the actual parameter varying curve and the normal parameter variance curve of a fabrication parameter.

Figure 1:
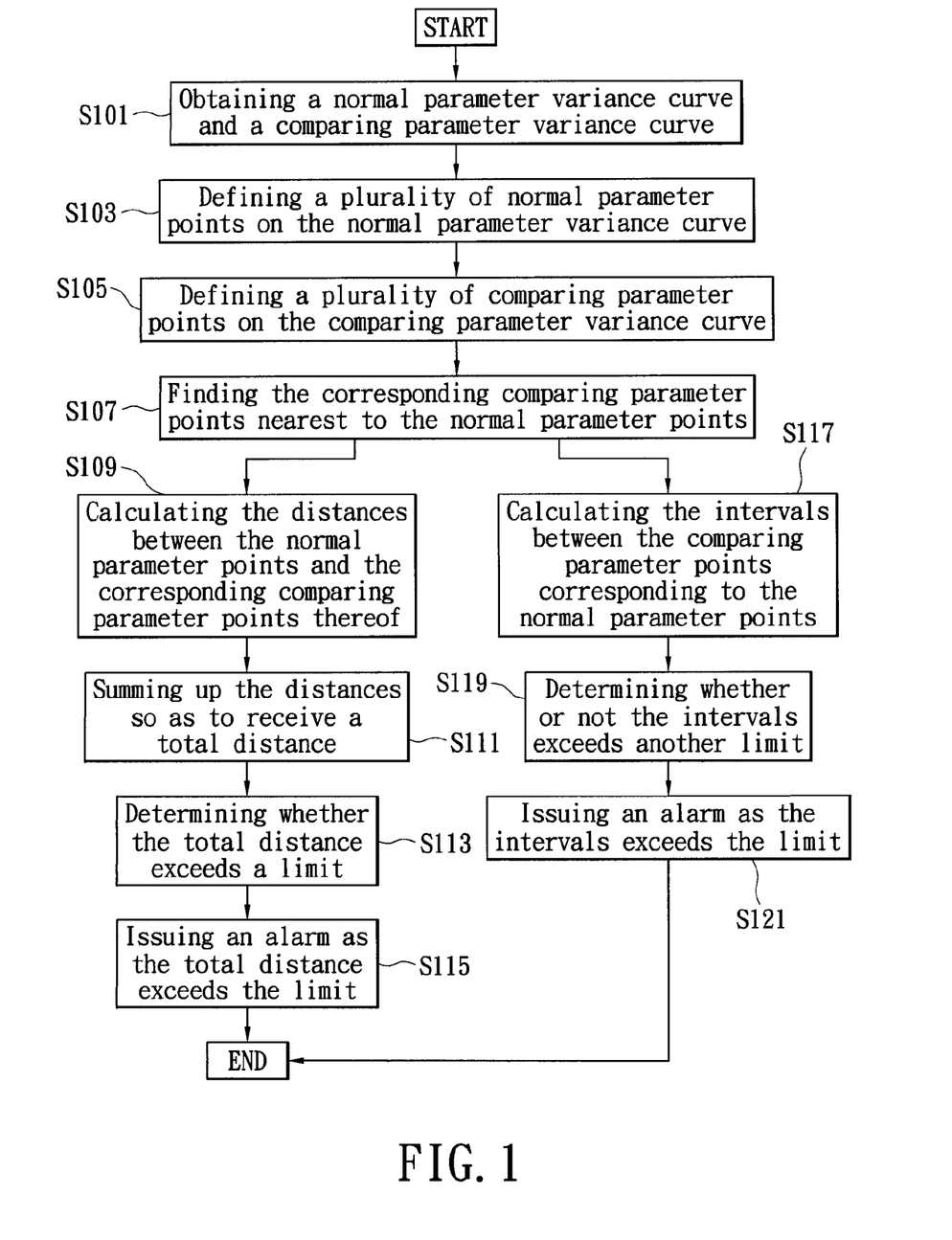
FIG. 1 is a flowchart of a method for monitoring fabrication parameters according to the present invention.
Figure 2:
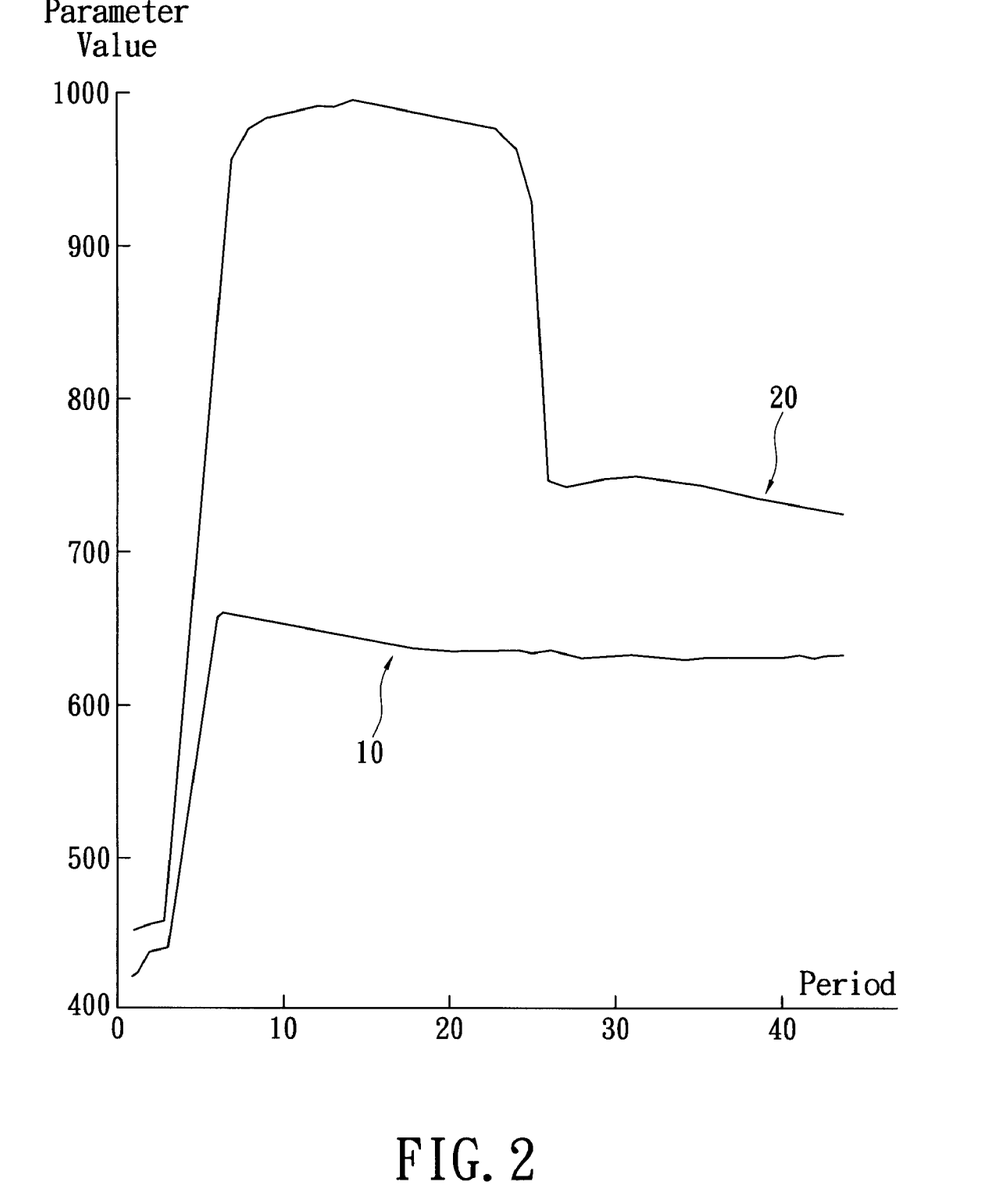
FIG. 2 is a diagram of a parameter variance curve according to the present invention.

Refer first to FIGS. 1 and 2, wherein the present method starts from obtaining a normal parameter variance curve 10 and a comparing parameter variance curve 20 (step S101). The normal parameter variance curve 10 indicates the variation of the fabrication parameter that a user intends to monitor ought to present over time, while the comparing parameter variance curve 20 shows the variation of the fabrication parameter intended to be monitored actually presented over time. The time period in FIG. 2, as well as in FIGS. 3 and 6 as illustrated hereinafter, shows the interval of fabrication parameter recording, e.g. total machining time is 80 seconds, with recording the fabrication parameter once per 1 second, thus indicating entirely 80 periods and each period representing 1 second.

As illustrated above, if the normal parameter variance curve 10 and the comparing parameter variance curve 20 are similar, then the fabrication parameter under monitoring is deemed to be normal. The determination of such similarity between the comparing parameter variance curve 20 and the normal parameter variance curve 10 can be based on the following steps.

Figure 3:
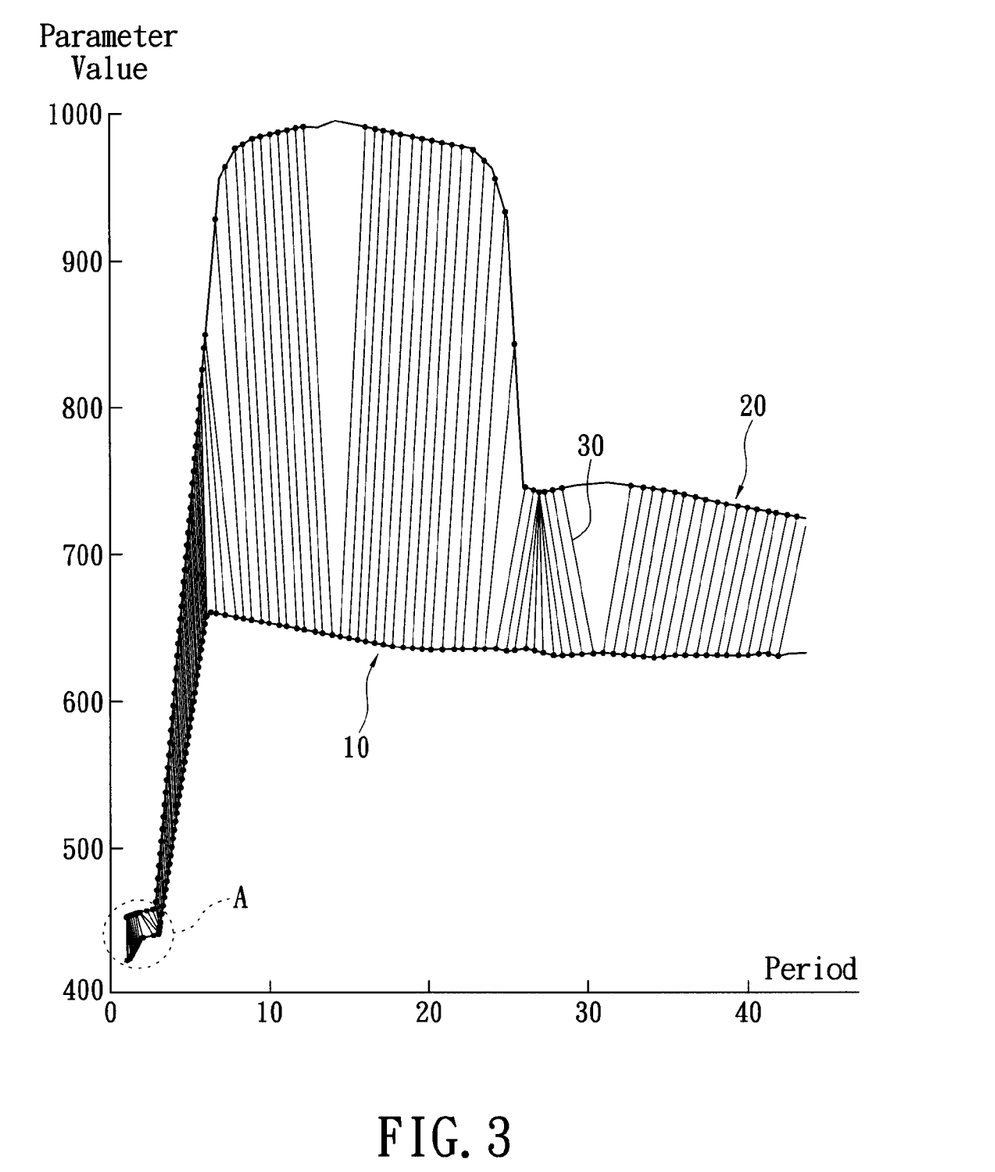
FIG. 3 is a diagram of the parameter variance curve and parameter points according to the present invention.
Figure 3A:
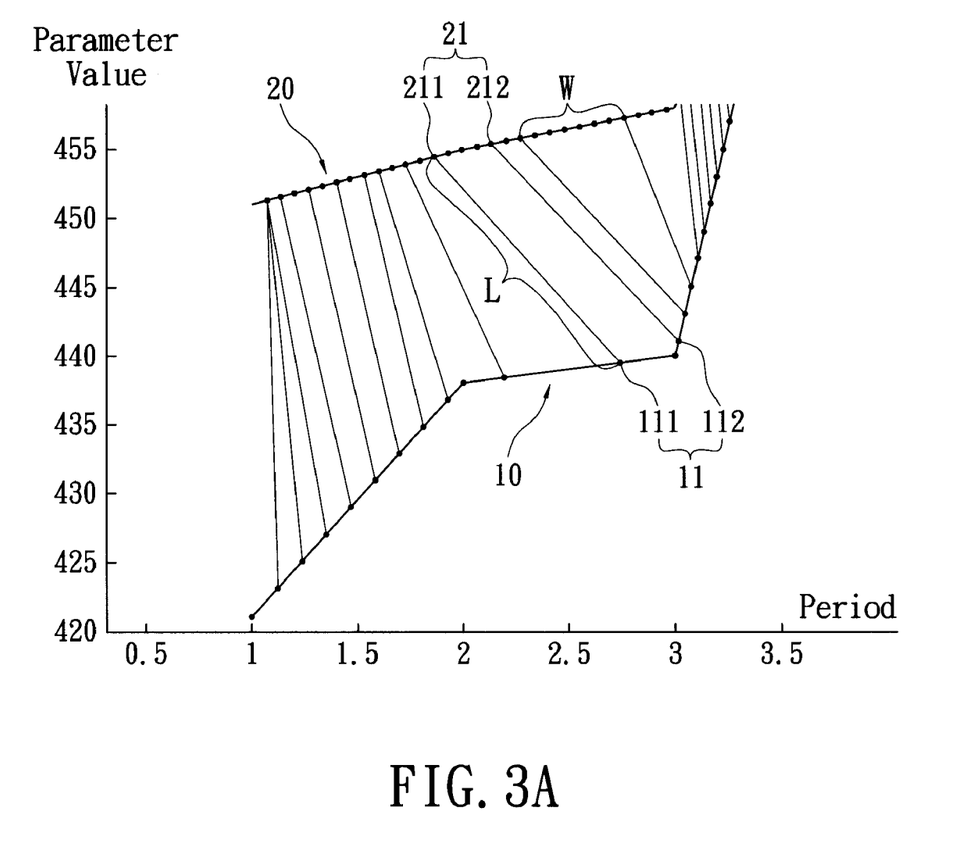
FIG. 3A is an enlarged diagram of FIG. 3.
Figure 4:
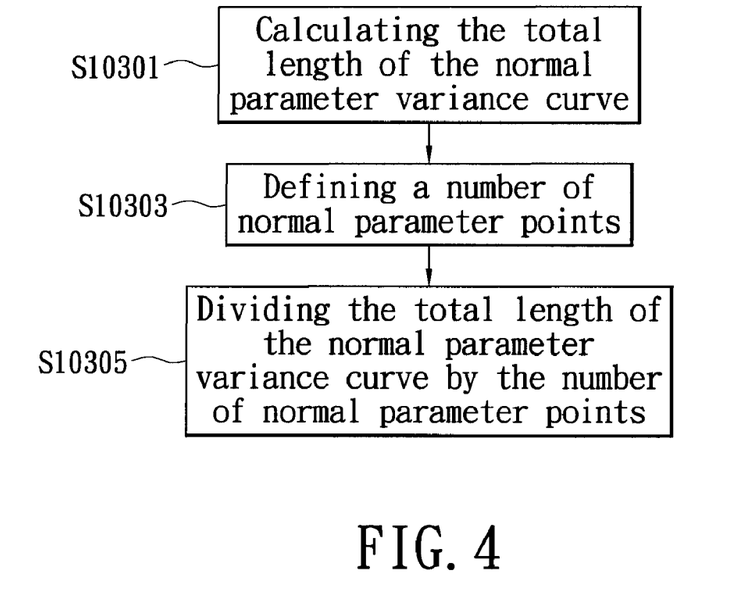
FIG. 4 is a flowchart for the Euclidean distance determination method of normal parameter points according to the present invention.

Refer now to FIGS. 3, 3A, and 4, wherein, after acquisition of the normal parameter variance curve 10, a plurality of normal parameter points 11 are defined on the normal parameter variance curve 10 (step S103). The Euclidean distance between every two consecutive normal parameter points 11 are nearly identical.

The Euclidean distance between the normal parameter points 11 can be calculated in accordance with the following steps: initially, calculating the total length of the normal parameter variance curve 10 (step S10301); next, defining the number of normal parameter points which can be decided by the user. The user can get the number of normal parameter points by multiplying the number of periods on the normal parameter variance curve 10 with a multiplier. For example, in FIG. 3, there are in total 80 periods in the normal parameter variance curve 10 from the start to the end of the machining operation, so that with a multiplier being two, then the number of normal parameter points can be set as twice of the 80 periods: which is 160 points (step 10303); finally, dividing the total length of the normal parameter variance curve 10 by the number of normal parameter points (step S10305). In this way, the Euclidean distance between every two consecutive normal parameter points 11 can be obtained.

Figure 5:
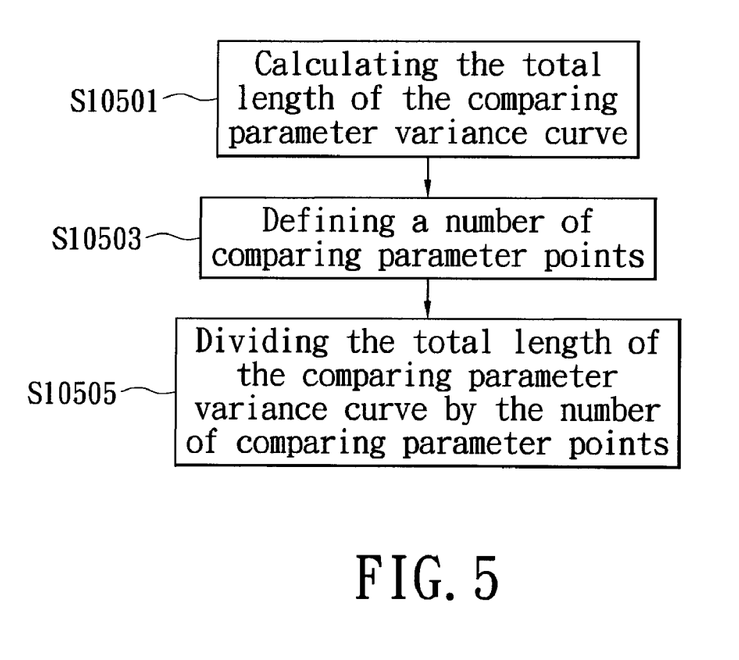
FIG. 5 is flowchart for the Euclidean distance determination method of comparing parameter points according to the present invention.

Refer next to FIGS. 3, 3A, and 5, wherein, similarly, after acquisition of the comparing parameter variance curve 20, a plurality of comparing parameter points 21 are also defined on the comparing parameter variance curve 20 (step S105); like the case for the normal parameter points 11, the Euclidean distance between every two consecutive comparing parameter points 21 are almost the same.

The Euclidean distance between the comparing parameter points 21 can be calculated in accordance with the following steps: initially, calculating the total length of the comparing parameter variance curve 20 (step S10501); next, defining the number of comparing parameter points, which typically outnumbers the normal parameter points 11, wherein the number of the comparing parameter points is a multiple of the number of the normal parameter points (step S10503); finally, dividing the total length of the comparing parameter variance curve 20 by the number of the comparing parameter points (step S10505).

After the definitions for the normal parameter points 11 and the comparing parameter points 21, it follows to determine for each normal parameter point 11, a corresponding comparing parameter point 21 nearest to it (step S107). Taking the normal parameter point 111 as an example, the corresponding comparing parameter point nearest to it is 211 (with shortest Euclidean distance between them). Since the comparing parameter points 21 outnumber the normal parameter points 11, not every comparing parameter point 21 is corresponded with a normal parameter point 11. For example, the normal parameter point 112 corresponds to the comparing parameter point 212, but there are four comparing parameter points 21 which are not corresponded between the comparing parameter point 211 and the comparing parameter point 212.

Subsequently, after finding the corresponding comparing parameter point 21 nearest to each normal parameter point 11, then continues to calculate the distance L between each normal parameter point 11 and the corresponding comparing parameter point 21 thereof (step S109). In calculations, it first links the normal parameter point 11 to the corresponding comparing parameter point 21 thereof with an imaginary connection line 30, and uses the length of the imaginary connection line 30 as the distance L. The distance L also indicates the difference of parameter values on the comparing parameter variance curve 20 and the normal parameter variance curve 10 in that period; next, summing up such distances L's so as to get a total distance (step S111).

Next, determines whether or not the total distance exceeds a limit (step S113), wherein the limit may vary according to different tools, different recipes etc. Suppose the total distance is smaller than the limit, this fact indicates that the difference of fabrication parameter values on the comparing parameter variance curve 20 and the normal parameter variance curve 10 in each period is not significant, so the comparing parameter variance curve 20 is considered normal, and the fabrication parameter represented by the comparing parameter variance curve 20 is accordingly good (i.e. within specification).

Contrarily, as illustrated in the present embodiment, in case that the total difference is greater than the limit, then the fabrication parameter corresponding to the comparing parameter variance curve 20 is deemed to be abnormal, and it is required to notify a user for further verification or maintenance. Therefore the tool or the information product executing the present method then generates an alarm to prompt the user (step S115).

In addition to determine normality of the comparing parameter variance curve 20 based on the total distance, the present invention can also alternatively determine the normality of the comparing parameter variance curve 20 based on the variation of the comparing parameter variance curve 20. The steps of the determination method comprise the following, and these steps continuous from step S107:

Initially, calculating the interval W between the comparing parameter points 21 corresponding to such normal parameter points 11 (step S117). For example, the comparing parameter point 211 and the comparing parameter point 212 is respectively corresponded by two adjacent normal parameter point 111 and 112, thus the interval W between the comparing parameter point 211 and the comparing parameter point 212 is 3 comparative parameter points 21, in which the interval W may also be indicated with a value.

Next, determining whether or not the interval W exceeds another limit (step S119). As described above in S113, the limit can differ based on various tools, recipes and so on. If any one of the intervals W's exceeds the limit, then it indicates that the trend of variation between the comparing parameter variance curve 20 and the normal parameter variance curve 10 presents significant deviation.

For example, in the present embodiment, during the period from the normal parameter point 111 to the normal parameter point 112, the comparing parameter variance curve 20 slowly rises up, so the fabrication parameter in this period is determined to be abnormal which requires the notification of the user for further verification or maintenance. Therefore, the tool or information product will issue an alarm to inform the user (step S121).

Figure 6:
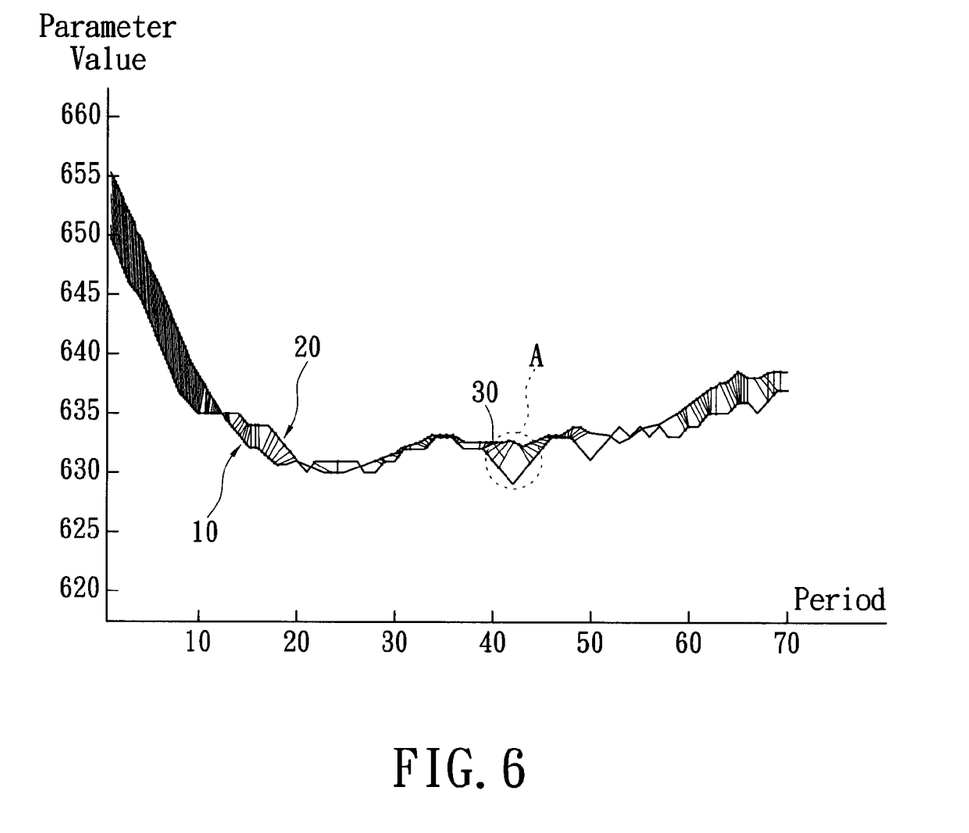
FIG. 6 is a diagram for another parameter variance curve and parameter points according to the present invention.
Figure 6A:
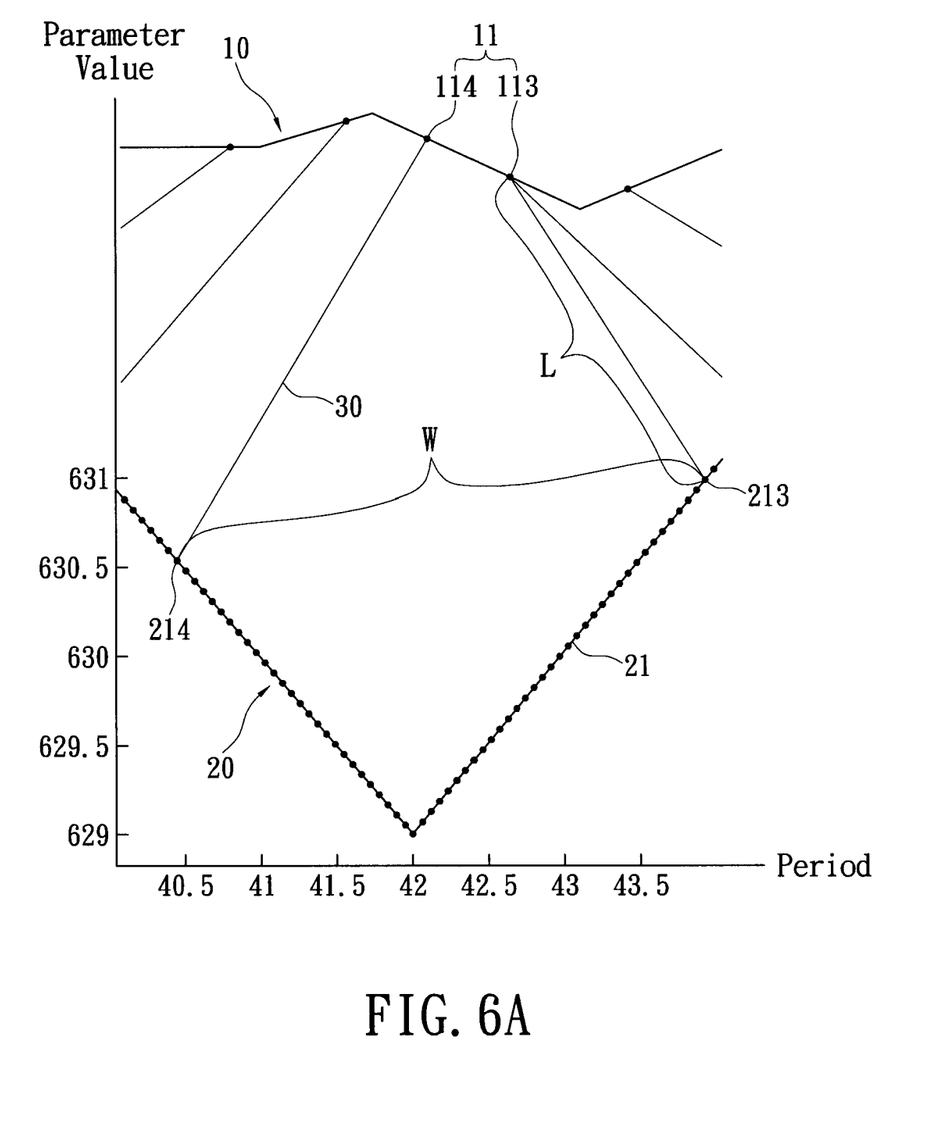
FIG. 6A is an enlarged diagram of FIG. 6.

In other embodiments, the limit illustrated in step S119 may be a multiple of the average of such intervals W's by a weighted value. Refer to FIGS. 6 and 6A, the average of the intervals W's between the comparing parameter points 21 corresponding to these normal parameter points 11 is 5 comparing parameter points 21, and the weighted value is defined as 5, so that the limit is 25 comparing parameter points 21.

Herein the interval W between two comparing parameter points 213, 214 corresponding to two adjacent normal parameters points 113, 114 is 60 comparing parameter points 21, which is far greater than the limit (25 points). As a result, there exists a significant variation in the comparing parameter variance curve 20 during this period, demonstrating greater difference in variation trend against the normal parameter variance curve 10.

Although the total distance of the comparing parameter variance curve 20 and the normal parameter variance curve 10, shown in FIG. 6, is smaller than the limit, through analysis on the interval W, abnormality in the comparing parameter variance curve 20 can nevertheless be revealed.

In summary, the method for monitoring fabrication parameters provides the following beneficial effects:

1. the present invention compares the integral difference between the comparing parameter variance curve 20 and the normal parameter variance curve 10 so as to determine the normality in the comparing parameter variance curve 20, thereby enabling more accurate determination;

2. the present invention further determines the normality in the comparing parameter variance curve 20 based on the trend of variation therein;

3. the present invention is programmable, with each step being executed by an information product, thus achieving faster execution time, allowing to monitor in real-time the results of parameter comparison.

The aforementioned illustrations set forth the preferred embodiments of the present invention, rather than being intended to limit the scope of the present invention thereto; hence all effectively equivalent changes, modifications, or alternations made by using the specification of the present invention and appended drawings are reasonably deemed as being encompassed by scope of the present invention delineated in the following claims.

What is claimed is:

1. A method for monitoring fabrication parameters applicable in semiconductor manufacturing, the method comprising the following steps:
    obtaining a normal parameter variance curve and a comparing parameter variance curve;
    defining a plurality of normal parameter points on the normal parameter variance curve;
    defining a plurality of comparing parameter points on the comparing parameter variance curve;
    finding the corresponding comparing parameter points nearest to the normal parameter points;
    calculating distances between the normal parameter points and the corresponding comparing parameter points thereof;
    summing up the distances so as to receive a total distance; and
    determining whether or not the total distance exceeds a limit.

2. The method for monitoring fabrication parameters according to claim 1, further comprising the following step:
    issuing an alarm when the total distance exceeds the limit.

3. The method for monitoring fabrication parameters according to claim 1, wherein a Euclidean distance between the normal parameter points are substantially the same.

4. The method for monitoring fabrication parameters according to claim 3, wherein the Euclidean distance between the normal parameter points is determined based on the following steps:
    calculating a total length of the normal parameter variance curve;
    defining a number of normal parameter points; and
    dividing the total length of the normal parameter variance curve by the number of normal parameter points, so as to get the Euclidean distance between the normal parameter points.

5. The method for monitoring fabrication parameters according to claim 1, wherein a Euclidean distance between the comparing parameter points is substantially the same.

6. The method for monitoring fabrication parameters according to claim 5, wherein the Euclidean distance between the comparing parameter points is determined based on the following steps:
    calculating a total length of the comparing parameter variance curve;
    defining a number of comparing parameter points; and
    dividing the total length of the comparing parameter variance curve by the number of comparing parameter points, so as to get the Euclidean distance between the comparing parameter points.

7. The method for monitoring fabrication parameters according to claim 1, wherein the comparing parameter points outnumber the normal parameter points.

8. The method for monitoring fabrication parameters according to claim 7, further comprising the following step:
    calculating intervals of the comparing parameter points corresponded to the normal parameter points.

9. The method for monitoring fabrication parameters according to claim 8, further comprising the following step:
    determining whether or not the intervals exceeds another limit.

10. The method for monitoring fabrication parameters according to claim 9, further comprising the following step:
    issuing an alarm when the intervals exceed the limit.

11. The method for monitoring fabrication parameters according to claim 8, wherein the limit is calculated by multiplying an average of the intervals with a weighted value.

12. The method for monitoring fabrication parameters according to claim 1, wherein the normal parameter variance curve and the comparing parameter variance curve is respectively generated by a Fault Detection and Classification (FDC) system.

13. A method for monitoring fabrication parameters applicable in semiconductor manufacturing, the method comprising the following steps:
    obtaining a normal parameter variance curve and a comparing parameter variance curve;
    defining a plurality of normal parameter points on the normal parameter variance curve;

defining a plurality of comparing parameter points on the comparing parameter variance curve;

finding the corresponding comparing parameter points nearest to the normal parameter points;

calculating distances between the normal parameter points and the corresponding comparing parameter points thereof;

summing up the distances so as to receive a total distance; and determining whether or not the total distance exceeds a limit;

wherein a Euclidean distance between the normal parameter points is substantially the same, and a Euclidean distance between the comparing parameter points is substantially the same.

14. The method for monitoring fabrication parameters according to claim 13, further comprising the following step:

issuing an alarm when the total distance exceeds the limit.

15. The method for monitoring fabrication parameters according to claim 13, wherein the Euclidean distance between the normal parameter points is determined based on the following steps:

calculating a total length of the normal parameter variance curve;

defining a number of normal parameter points; and dividing the total length of the normal parameter variance curve by the number of normal parameter points, so as to get the Euclidean distance between the normal parameter points.

16. The method for monitoring fabrication parameters according to claim 13, wherein the Euclidean distance between the comparing parameter points is determined based on the following steps:

calculating a total length of the comparing parameter variance curve;

defining a number of comparing parameter points; and dividing the total length of the comparing parameter variance curve by the number of comparing parameter points, so as to get the Euclidean distance between the comparing parameter points.

17. The method for monitoring fabrication parameters according to claim 13, wherein the comparing parameter points outnumber the normal parameter points.

18. The method for monitoring fabrication parameters according to claim 13, wherein the normal parameter variance curve and the comparing parameter variance curve is respectively generated by a Fault Detection and Classification (FDC) system.

* * * * *